United States Patent [19]

Ugon

[11] Patent Number: 4,591,945
[45] Date of Patent: May 27, 1986

[54] DEVICE FOR PROTECTING ELECTRONIC CIRCUITS AGAINST ELECTROSTATIC CHARGES

[75] Inventor: Michel Ugon, Maurepas, France

[73] Assignee: Compagnie Internationale pour l'Informatique CII-Honeywell Bull (Societe Anonyme), Paris, France

[21] Appl. No.: 682,584

[22] Filed: Dec. 17, 1984

Related U.S. Application Data

[63] Continuation of Ser. No. 596,078, Apr. 2, 1984, abandoned, which is a continuation of Ser. No. 367,937, Apr. 13, 1982, abandoned.

[30] Foreign Application Priority Data

Apr. 30, 1981 [FR] France .................................. 81 08717

[51] Int. Cl.[4] ............................ G06K 7/08; H05F 3/02
[52] U.S. Cl. ....................................... 361/212; 235/451; 235/487
[58] Field of Search ......................... 357/74; 361/212; 235/451, 487, 494; 340/825.33

[56] References Cited

U.S. PATENT DOCUMENTS 3,974,332  8/1976  Abe et al. ................... 235/451 X

Primary Examiner—A. D. Pellinen
Assistant Examiner—T. DeBoer
Attorney, Agent, or Firm—Kerkam, Stowell, Kondracki & Clarke

[57] ABSTRACT

An insulative data carrier of the credit card type having a protective device that protects electronic circuits, such as integrated circuits (3a, 3b), incorporated therein against electrostatic charges, said electronic circuits being mounted on an auxiliary electrically insulating carrier element (2, 4) disposed within a recess in an insulative carrier and having fixed input/output contacts (5) connected by an interconnecting net (6, 7) to input/output terminals (8) mounted on said auxiliary carrier element (4). The terminals (8) are accessible from the outside and are concentrated in at least one zone of the carrier element (4). At least one metal ring (20) carried by said carrier element (4) is mounted so as to circle said input/output terminals (8) concentrated in said zone.

12 Claims, 2 Drawing Figures

DEVICE FOR PROTECTING ELECTRONIC CIRCUITS AGAINST ELECTROSTATIC CHARGES

This is a continuation of application Ser. No. 596,078 filed Apr. 2, 1984 which is a continuation of application Ser. No. 367,937 filed Apr. 13, 1982, both abandoned.

BACKGROUND OF THE INVENTION

1. Field of the Invention

The broad object of the invention is an invention for protecting electronic circuits, such as integrated circuits, against electrostatic charges, and it applies particularly to the protection of integrated circuits mounted on an electrically insulating carrier element, with the assembly (integrated circuits/carrier element) forming, for instance, a portable data carrier of the "credit card" type.

2. Description of the Prior Art

The advent of microprocessors has made possible popularization of data processing techniques in mass market applications of credit cards. Such personalized portable data carriers or "credit cards" are currently under development. A typical banking data processing application is described in the September 1980 issue of the *American Banking Association (ABA) Journal* in the article by Mr. Bill Orr, "The chip card is here, but where is it going?" A typical medical data processing application is described in the promotional flyer of the assignee of the present invention, Cii Honeywell Bull, emitted "Individual Cardiology file on CP8 memory card" which appeared as a supplement in "The Communicator", a marketing communication service publication of Cii/HB, dated June, 1981. Such a card consists of a carrier element with electrically insulated integrated circuits, which allow data input of a general and confidential nature, and it also permits internal and external processing of this data.

Generally speaking, an integrated circuit consists of a chip with a few sluare millimeters of surface, on one face of which are mounted electronic circuits, including fixedinput/output contacts connected by leads to an interconnecting net mounted on the carrier element. This interconnecting net includes input/output terminals which can be reached from the outside to allow the necessary outside connections to be made.

To improve the mechanical, thermal and electrical properties of such a card, there is usually provided a protective device for the IC's (integrated circuits) consisting of an electrically insulating coating, which partially covers the card-carrying element, while leaving the input/output terminals accessible.

In view of its nature and portable character, such a card is, of course, likely to be subject to the action of electrostatic charges produced particularly by the effect of various frictions to which the card-carrying element could be subjected while not in use.

The action of these electrostatic charges is all the more sensitive because these IC's usually require high-insulation technologies such as, for instance, the MOS technology, which offers the advantage of high-density integration. Indeed, the MOS technology, and particularly the N. MOS technology, affords certain protections against all kinds of electrostatic charges, which could destroy the circuits by short-circuiting the GATE-SOURCE gaps.

The invention aims at overcoming this inconvenience by using a protective device designed to insulate mainly the above mentioned input/output terminals, which are accessible from the outside, to prevent the electrostatic charges, which are loaded at the level of the card-carrying element and which are distributed over this carrier element as a function of the various frictions to which it could be exposed, from creating microarcs which are likely to spark by point effect between the carrier element and one of the input/output terminals of the card.

SUMMARY OF THE INVENTION

For this purpose, the invention proposes a protective device for electronic devices, such as IC's, against electrostatic charges. Electronic circuits are; mounted on an electrically insulating support or carrier element with input/output terminals connected by an interconnecting net to input/output terminals carried by said carrier element, accessible from the outside, and disposed or concentrated in at least one zone of said carrier element. The invention is characterized in that at least one metal protective ring is mounted on said carrier element and mounted so as to circle said input/output terminals concentrated or grouped in said zone.

According to another feature of the invention, the protective metal ring is electrically connected to one of the input/output terminals, preferably to the input/output terminal used as the ground.

According to still another feature of the invention, the above mentioned input/output terminals are shaped as conducting areas located in the immediate vicinity of each other, with the above mentioned protective ring itself being situated in the immediate vicinity of the outside periphery as delimited by the group of said conducting areas.

According to yet another feature of the invention, the protective metal ring is open to prevent possible induction phenomena.

Such a protective device has the advantage of limiting the short-circuit phemomena at the level of the IC's, phenomena which are particularly created by electrostatic charges likely to be loaded in the carrier element during its handling by the users. Such a protection contributes toward increasing the card life time.

BRIEF DESCRIPTION OF THE DRAWINGS

Other features and advantages of the invention will be better understood from a consideration of the ensuing description offered by way of non-limitative example, and from the attached drawings, in which.

DESCRIPTION OF THE PREFERRED EMBODIMENT

Figure 1:
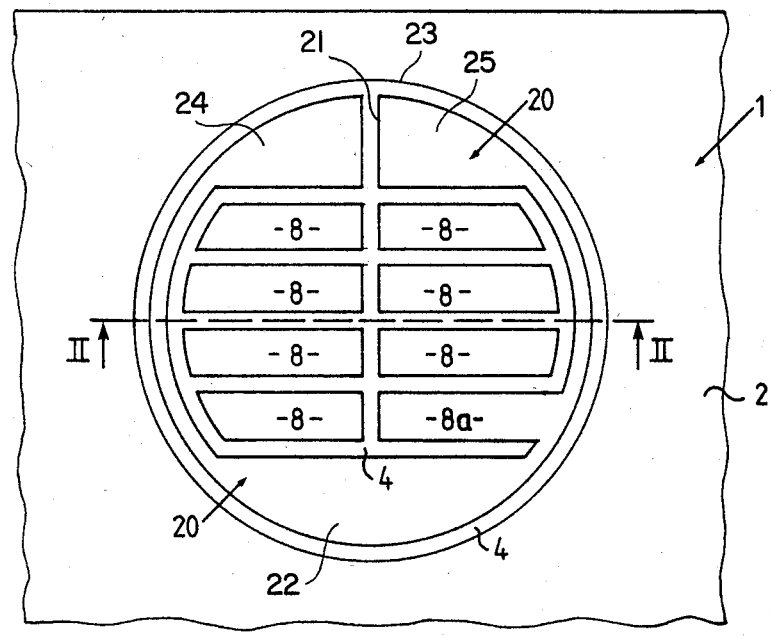
FIG. 1 is an enlarged fragmentary top view of a data carrier such as a credit card, including the protective device in accordance with the invention.

The embodiment of the invention illustrated in FIG. 1 and 2 concerns a portable and personalized data carrier (1) hereinafter called "credit card". In accordance with the teachings of this invention, this card includes a protective device (20) provided to protect against electrostatic charges.

The card (1) consists essentially of:

a carrier element (2), e.g., of polyvinyl chloride (PVC), and

IC's, e.g., a microprocessor chip (3a) and a PROM (Programmable Read Only Memory) chip (3b) capable of processing data. Such a card (1) is more particularly described in French Pat. No. 2,401,459 corresponding to U.S. Pat. No. 4,211,919 and in French patent application filed under No. 782 9 844 by the applicant published under No. 2,439,478 corresponding to U.S. Pat. No. 4,264,917. Reference may also be made to applicant's U.S. Pat. No. 4,211,919 entitled Portable Data Carrier Including A Microprocessor.

Figure 2:
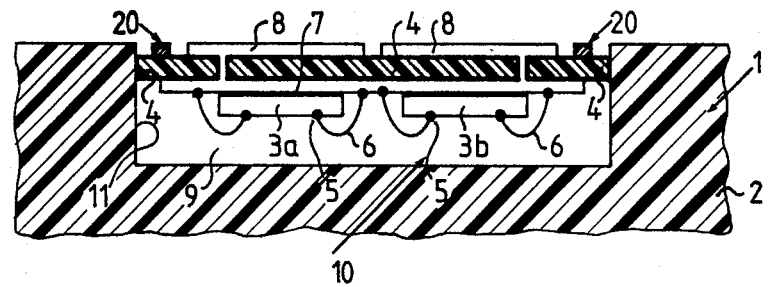
FIG. 2 is a cross-sectional view taken along the line II—II of FIG. 1.

Now, referring to FIG. 2, the IC's (3a) and (3b) are mounted on one face of an auxiliary insulating carrier element (4), such as a small slab. The fixed input/output contacts of these IC's (3a), (3b) are each connected by leads (6) to internally facing contacts of an interconnecting net (7) likewise mounted on the slab (4). This interconnecting net (7) also includes externally facing input/output terminals (8) as contact areas accessible from the outside. In the present example, IC's (3a), (3b) are mounted on one internally facing side or face of the slabs (4), while the input/output terminals (8) are situated on the other externally facing side of the slab (4).

For protection, the IC's (3a), (3b) are protected by an electrically insulating coating (9), which partially coats the slab (4) while leaving the contact areas (8) accessible, and this assembly forms a package (10).

A recessed hole (11) is cut in the PVC carrier element (2), which forms the framework (1) of the card, and the previously described package (10) with its contact areas (8), which are still accessible from the outside, is inserted into this recessed hole.

In accordance with the teachings of the invention, a conductive protective device (20) is provided against the electrostatic charges likely to be loaded in the card (1). This protective device (20) may be a metal member having closely spaced ends which form a gap 21 therebetween, as shown in FIG. 1, and may be an open metal ring which circles the contact areas (8), said ring being mounted, e.g., on the slab (4) of the package (10).

In such an assembly, one of the input/output terminals (8) is used as a ground terminal for the IC's (3a) and (3b), said terminal being (8a). Advantageously, according to one feature of the invention, the protective metal ring (20) can be connected to this ground terminal (8a).

To enhance the protective effect of the metal ring (20), it is practical, for reasons to be explained later, to take the following steps:

the contact areas (8) on the slab (4) are grouped or concentrated so that these contact areas delimit a minimum surface, while still providing a minimum free space between two adjacent contact areas, and the protective ring (20) is placed in the immediate vicinity of the above mentioned surface, while leaving a minimum space between this ring (20) and the periphery of said surface.

Due to the nature and portable character of the card (1), this card will eventually be subject to the action of electrostatic charges. More particularly, the electrostatic charges loaded in the PVC carrier element (2) of the card are distributed over the latter as a function of the various frictions to which the card (1) is subjected. Without the protective ring (20), microarcs might be created, which are likely to spark by point effect between the carrier element (2) and one of the input/output terminals (8). These microarcs are likely to damage the IC's (3c) and (3b), particularly when these are built along the principles of an MOS technology, by short-circuiting the GATE-SOURCE gaps.

With the presence of the protective ring (20), which circles the input/output terminals (8), the above mentioned microarcs will spark at this ring level, thus preventing the IC's (3a) and (3n) from being damaged.

By limiting to a maximum the free spaces between the input/output terminals (8) and between these terminals and the protective ring (20), the accumulation of electrostatic charges at the level of the corresponding zone of the slab (4) is limited, as is the destructive action of these charges.

According to another feature of the invention, the protective ring (20) is open as at 21 for self-protection against possible and well-known induction phenomena.

The protective ring (20) thus forms an equipotential, which insulates the input/output terminals (8) against the action of electrostatic charges likely to accumulate in the carrier element (2) of the card (1). Inside this protective ring (20), the spaces between the contacts are limited to a maximum in order to limit the accumulation of charges in these spaces. Furthermore, bringing closer together the input/output terminals (8) offers the advantage of distributing almost evenly the electrostatic charges likely to accumulate at the level of these terminals, which enables the action of these charges to be neutralized.

Preferably, the protective ring (20) should have a relatively large surface so that it will be the first to be touched when handled with the fingers, for example. Since the ring (20) is connected to the ground terminal (8a), any electrostatic discharge will flow normally without the risk of damaging the IC's (3a) and (3b). Furthermore, it would also be advisable to make this ground contact prior to the others by means of the business machine in which the card (1) is to be inserted, which justifies the relatively large surface of the protective ring (20) as provided at upper and lower sides thereof, as shown in FIG. 1, the open ring at 21 enabling the establishment of two large surface areas 24, 25.

It will be understood that the invention is not limited to credit card applications, but that it can be used with any data carrier using IC's designed in a technology which is sensitive to the effects of electrostatic charges. Moreover, the same data carrier, to which the invention is applied, may include a plurality of protective rings (20) as a function of the number of input/output terminals, which might not be grouped in the same zone with a relatively small surface.

I claim:

1. In combination, electronic circuits, such as integrated circuits, mounted on an electrically insulating carrier element and a device for protecting the electronic circuits against damage due to electrostatic charges accumulating on the carrier element, said electronic circuits having fixed internal input/output contacts connected by an interconnecting net to external input/output terminals mounted on said carrier element, said terminals being accessible from the outside of the carrier element and concentrated in at least one zone of said carrier element, the device comprising at least one protective conductor element comprising a metal member having first and second ends closely spaced to one another to form a gap therebetween and being carried by said carrier element, the metal member being connected to ground and being mounted closely adjacent to and so as to surround said input/output terminals concentrated in said zone so as to prevent said electrostatic charges from reaching said terminals.

2. The device as set forth in claim 1, wherein said metal member is electrically connected to one of said input/output terminals.

3. The device as set forth in claim 1, wherein said input/output terminals are similarly shaped conducting areas located in the immediate vicinity of each other, said conductor element itself being in the immediate vicinity of the outside periphery delimited by all said conducting areas.

4. The device as set forth in claim 1 wherein said electronic circuits comprise a microprocessor and a programmable read-only memory connected to form with said electrically insulating carrier element a portable data carrier, such as a credit card.

5. A device as set forth in claim 1 wherein one of said input/output terminals is adapted to be maintained at ground potential and said protective conductor element is electrically connected to said one terminal.

6. A device as set forth in claim 1, wherein said conductor element comprises a ring.

7. A credit card comprising an insulative carrier having a recess cut therein, an auxiliary insulating carrier element within said recess having one face facing internally of said recess and one face facing externally of said recess, a conductive interconnecting net disposed on both faces of said auxiliary carrier element, integrated electronic circuit chips mounted to the internally facing face of said auxiliary carrier element and having fixed input/output contacts electrically connected to said interconnecting net on the internally facing face of said auxiliary carrier element, said interconnecting net on the externally facing face of the auxiliary carrier element providing a group of contacts concentrated in at least one zone of the insulative carrier and providing input/output terminals for said chips accessible from the exterior of said auxiliary carrier element, and at least one protective conductor element comprising a conductive member having first and second ends closely spaced to one another so as to form a gap therebetween, the conductive member being connected to ground and being mounted to the externally facing face of the auxiliary carrier element closely adjacent to and surrounding said input/output terminals concentrated in said zone so as to protect said electronic circuit chips from damage due to electrostatic charges accumulating on said insulative carrier.

8. The device as set forth in claim 7, wherein said conductor element is electrically connected to one of said input/output terminals.

9. The device as set forth in claim 7 wherein said input/output terminals are similarly shaped conducting areas located in the immediate vicinity of each other, said protective conductor element itself being in the immediate vicinity of the outside periphery delimited by all said conducting areas.

10. The device as set forth in claim 7 wherein said electronic circuits comprise a microprocessor and a programmable read-only memory connected to form with said electrically insulating carrier element a portable data carrier.

11. A device as set forth in claim 7 wherein one of said input/output terminals is adapted to be maintained at ground potential and said conductor element is electrically connected to said one terminal.

12. A device as set forth in claim 7, wherein said conductor element comprises a ring.

* * * * *